United States Patent
Simkins, Jr. et al.

(10) Patent No.: US 10,013,797 B1
(45) Date of Patent: *Jul. 3, 2018

(54) ANALYSIS-SUITABLE GEOMETRY FROM DISCRETE POINT SETS USING A MESH-FREE METHOD

(71) Applicants: Daniel Craig Simkins, Jr., Wesley Chapel, FL (US); Joseph Bradley Alford, Tampa, FL (US)

(72) Inventors: Daniel Craig Simkins, Jr., Wesley Chapel, FL (US); Joseph Bradley Alford, Tampa, FL (US)

(73) Assignee: University of South Florida, Tampa, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/629,216

(22) Filed: Jun. 21, 2017

Related U.S. Application Data

(63) Continuation of application No. 14/683,361, filed on Apr. 10, 2015, now Pat. No. 9,715,760.

(60) Provisional application No. 61/994,541, filed on May 16, 2014.

(51) Int. Cl.
| | |
|---|---|
| *G06T 17/00* | (2006.01) |
| *G06T 19/20* | (2011.01) |
| *G06T 17/50* | (2006.01) |
| *G06T 15/08* | (2011.01) |
| *G06T 17/10* | (2006.01) |
| *G06F 17/50* | (2006.01) |

(52) U.S. Cl.
CPC .......... *G06T 17/00* (2013.01); *G06F 17/5009* (2013.01); *G06T 15/08* (2013.01); *G06T 17/10* (2013.01); *G06T 19/20* (2013.01); *G06T 2210/41* (2013.01); *G06T 2219/2016* (2013.01)

(58) Field of Classification Search
CPC ......... G06T 13/00–13/60; G06T 15/00–15/87; G06T 17/00–17/30; G06T 19/00–19/20; G06F 17/50
See application file for complete search history.

(56) References Cited

PUBLICATIONS

Löhner, Rainald, and Eugenio Oñate. "A general advancing front technique for filling space with arbitrary objects." International Journal for Numerical Methods in Engineering 61.12 (2004): 1977-1991.*

Horton et al., A meshless Total Lagrangian explicit dynamics algorithm for surgical simulation, Int. J. Numer. Meth. Biomed. Engng. 2010; 26:977-998.

(Continued)

*Primary Examiner* — Daniel Hajnik
(74) *Attorney, Agent, or Firm* — Nicholas Pfeifer; Smith & Hopen, P.A.

(57) ABSTRACT

The present invention includes a method of creating analysis suitable models from discrete point sets. The proposed methodology is completely automated, requiring no human intervention, as compared to traditional mesh-based methods that often require manual input. The present invention is directly applicable to engineering approaches in medicine where the object to be analyzed is described by discrete medical images, such as MM or CT scans. Moreover, the present invention is useful in any application where the object of interest is created from digitized imaging technology.

16 Claims, 14 Drawing Sheets

(56) References Cited

PUBLICATIONS

Faas et al., Interactive mesh-free stress analysis for mechanical design assembly with haptics. ASME 2007 International Design Engineering Technical Conferences and Computers and Information in Engineering Conference. American Society of Mechanical Engineers, 2007.

Zhou, J. X., et al. "A nodal integration and post-processing technique based on Voronoi diagram for Galerkin meshless methods." Computer methods in applied mechanics and engineering 192.35 (2003): 3831-3843.

Horton, Ashley, Adam Wittek, and Karol Miller. "Towards meshless methods for surgical simulation." Computational Biomechanics for Medicine Workshop, Medical Image Computing and Computer-Assisted Intervention MICCAI. 2006.

Li, Shaofan, and Wing Kam Liu. "Meshfree and particle methods and their applications." Applied Mechanics Reviews 55.1 (2002): 1-34.

Lee, James D., et al. "Modeling and simulation of osteoporosis and fracture of trabecular bone by meshless method." International journal of engineering science 45.2 (2007): 329-338.

Guo, Xiaohu, and Hong Qin. "Meshless methods for physics-based modeling and simulation of deformable models." Science in China Series F: Information Sciences 52.3 (2009): 401-417.

Movania, Muhammad Mobeen, et al. "Coupling between meshless FEM modeling and rendering on GPU for real-time physically-based volumetric deformation." (2012).

Moenning, Carsten, et al. "Meshless geometric subdivision." Graphical Models 69.3 (2007): 160-179.

Faure, et al. "Sparse meshless models of complex deformable solids." ACM transactions on graphics (TOG) 30.4 (2011): 73.

Li, Shaofan, and Wing Kam Liu. "Approximation Theory of Meshfree Interpolants." Meshfree Particle Methods (2004): Chapter 4; pp. 142-186.

\* cited by examiner

ANALYSIS-SUITABLE GEOMETRY FROM DISCRETE POINT SETS USING A MESH-FREE METHOD

CROSS-REFERENCE TO RELATED APPLICATIONS

This nonprovisional application is a continuation of and claims priority to nonprovisional application Ser. No. 14/683,361, entitled "ANALYSIS-SUITABLE GEOMETRY FROM DISCRETE POINT SETS USING A MESH-FREE METHOD," filed Apr. 10, 2015 by the same inventor(s), which claims benefit of provisional application No. 61/994,541, entitled "ANALYSIS-SUITABLE GEOMETRY FROM DISCRETE POINT SETS USING A MESH-FREE METHOD," filed May 16, 2014 by the same inventor(s).

FIELD OF INVENTION

This invention relates to modeling and analysis of an object. More specifically, the present invention provides a method for creating an analysis suitable geometric description of an object that is represented as a discrete point set.

BACKGROUND OF THE INVENTION

Modern engineering analysis has led to major improvements in product design and innovation. Integrated geometric design tools, Computer Aided Design (CAD), with finite element packages are ubiquitous. Building on this success, researchers and practitioners would like to extend the application of engineering analysis to problems of existing systems, i.e. ones that were not created within a CAD system. Such domains might include forensics, reverse engineering, analysis of the natural environment, and the life sciences. An emerging area of great interest is bringing the success of engineering analysis enjoyed in product design to medicine. The goal is to be able to engineer specific medical treatments for each patient, referred to as patient-specific medicine. The common thread linking these diverse domains is that the geometry of the problem to be analyzed does not come with a ready mathematical description, as in CAD, but rather in the form of a set of discrete points. The challenge, then, is to develop an analysis-suitable description of the problem domain directly from the point set.

Currently, there exists visualization models, which are typically mesh-based, and often only represent the outer surface of the object. Their purpose is to be displayed on a graphics device, and the only requirement for these models is that they look good. There is no requirement that visualization models be anything more than realistic looking models. Hence, there is never a discussion on accuracy or comparison to known exact solutions to actual problems. It is generally easy to get a reasonable visualization model from a point set, but the resulting mesh often has serious geometric and/or topological flaws that prevent it from being usable to solve the actual equation of engineering and physics that govern the actual behavior of the object.

While visualization models have existed prior to computers and have become fairly simple to create, behavior models necessarily require a computer to properly simulate the behavior of the object. Prior to the present invention, the digitized models have required considerable amount of manual human intervention to guide the computer software to alter the visualization models into models suitable for simulation, which is explained in greater detail below. Thus, the computer graphics industry must spend a considerable amount of time and effort to develop behavior models.

Behavior models are also referred to by practitioners in the field as analysis-suitable geometry (ASG). Strictly speaking, this means that the model possesses the correct mathematical qualities to allow one to solve the actual governing equations of physics, chemistry, and biology using the models. Analysis-suitable geometries serve as visualization models, as well, so if one has an ASG, there is no need for a separate visualization model. Because one can solve the actual governing equation on an ASG, one is modeling the actual behavior of the object, not just providing a visual display or movie of how the object might look.

The significance of the present invention is in the radical reduction of time required to build an ASG from a digital point set. As an example, the inventor has built two, high-fidelity ASG models, one for a human brain, and another for the female pelvic floor. The brain was built as an ASG using the method of the present invention in about 1 minute of CPU time. Using existing technology, that same model would take roughly 4 engineers 1 year to build and cost about $1.2 million. The pelvic floor model was built in less than 10 minutes CPU time. The best model creation time by the leaders in the field for the same model is 18 months. The reason for these lengthy build times is the immense effort required to take a visualization mesh model, and fix it up to make it analysis-suitable.

An ASG model opens the door to applying engineering design techniques to patient-specific medicine. For the pelvic floor, it can be used to run virtual childbirth simulations for a pregnant woman to engineer her delivery for minimizing damage to her body and lowering risk for later life diseases. The brain can be used to model traumatic brain injury for improving design of protective gear. Unfortunately, existing methods of developing ASGs are too time consuming and costly to build for patient specific medicine, as further explained below.

One existing method for developing an ASG representation is to mesh a point set for use in finite elements, as exemplified in FIG. 1. This option includes difficulties in developing a mesh that is topologically sound, i.e. does not intersect or overlap, does not have holes or gaps, etc., can be quite difficult. In practice, an analyst often must manually assist in the meshing process. Such efforts are time-consuming and expensive in human time. Efforts have been made to automate the task of generating quality finite element meshes for complex geometry with some success. For example, generic template meshes have been mapped to patient specific geometry in order to curtail human effort [Salo, Beek, and Whyne (2013), Baghdadi, Steinman, and Ladak (2005) and Bucki, Lobos, and Payan (2010)]. Yet, simulating large deformations proves troublesome for these meshes.

Another option is to use a mesh free method. The computation of mesh free shape functions requires each point to be associated with a compact support and that the compact supports overlap, such that they cover the domain. Each point must also associate with a portion of volume. Many of the proposed methods for computing particle volume and supports rely on Voronoi diagrams or other mesh concepts. Generating such diagrams can be expensive in $R^3$, so avoiding them is crucial in developing an automatic and efficient method. $R^3$ is a symbol for a set of three-dimensional points that can be represented as a vector.

Another method, U.S. Pat. No. 8,854,366 B 1 to Simkins et al., teaches building an ASG from a discrete point set using a method known as the Reproducing Kernel Element Method (RKEM). The RKEM method is based on a mesh of the problem domain. The subject of the disclosure was how to develop a smooth ASG from an arbitrary point set, but the method still requires one to generate a mesh of the point set, then develop the geometric representation along with a method to help determine what the mesh should be. The Simkins patent necessitates the generation of an initial mesh, referred to as the "surface triangularization," to generate additional points for the mesh-free representation. The current invention obviates any requirement to use an initial mesh. For the exemplary application discussed below, a voxel mesh is initially used, which is easily obtained from medical images for determining the representative volume associated with each particle (also called a mesh free node or vertex). The distinction is that the present invention does not require generating a triangularization of an arbitrary point set. The exemplary application simply utilizes the voxel mesh that is provided through the imaging. Another distinction between the current disclosure and the issued patent is that the previous method requires that any new points added from the mesh free method, have a pre-image point associated with it in the mesh. The current method does not. In the previous method, the boundary of a geometric object and its interior is defined by the points contained in a mesh that is created by the mesh free method known as the Reproducing Kernel Element Method (RKEM). The current application defines the extent of the body by the solvability of some mathematical equations known as the "consistency conditions" as represented by the "moment matrix." Using the solvability criteria allows for the determination as to whether points are inside or outside the body without referring to any mesh at all. The present invention is the first to apply and exploit this definition to completely define an analytic geometry from an arbitrary point set.

Another method is disclosed by Lee et. al in "modeling and simulation of osteoporosis and frature of trabecular bone by meshless method." Lee creates a meshless analysis-suitable geometry from CT scan data for trabecular bone, but several differences are important to note. First, Lee's method only works with structured, dense point sets, such as those coming from CT and MIII machines. The invention can use, but does not require such restrictions on input data. Note that it is well known in the community that structured dense points can easily be converted into an analysis-suitable geometry by creating a structured hexahedral mesh at each pixel in an individual slice, extending to the next slice. There are some nuances and choices to be made in that process, but they are not materially different from each other. Such models are called voxel models. Thus, Lee starts with a mesh and converts the voxels to meshfree particles. It is precisely this process the invention seeks to avoid, if desired, or required. Lee does down-sampling, as noted by "10×10×10 nodes, each corresponding to a set of 3×3×3 pixels," but that is still constrained to be a structured dense set, and hence a voxel mesh, just coarser in resolution. The invention's approach to coarsening does not have that restriction. Further, in Equations 4 and 5 on p 333, Lee gives the boundary conditions for the loading of the model. To apply boundary conditions, which, by definition are on the surface of the model, Lee has to either use the surface of the underlying voxel mesh to apply boundary conditions, or assume the outer most particles are on the boundary. In the former case, Lee is relying on a mesh and his geometry is a hybrid of meshfree and mesh, with the interior volume represented by meshfree particles, and the boundary represented by the surface of the voxel model. It is worth noting that the surface of a voxel model is, in fact, a surface mesh. In the latter case, this is an assumption on the location of the boundary, which is not true, and is fundamental to the concept of the invention. Due to the non-local nature of meshfree shape functions, they will not be coincident with the locations of the boundary particles. Normally, meshfree basis functions do not have a precise boundary, as discussed above, but the invention provides a well-defined and computable boundary for meshfree modeling.

The present invention provides a new method based on a mesh free Galerkin formulation, in particular the Reproducing Kernel Particle Method (RKPM), to form an ASG of a discrete point set such as an anatomical structure. The use of the mesh free method known as the Reproducing Kernel Particle Method is incidental to the invention. Other mesh free methods, for example the Element Free Galerkin (EFG) method could be used equally as well.

In the mesh free method, no mesh is required for the analysis, and hence the troubles of meshing are avoided. Some implementations of mesh free methods still use a background mesh for integrating the weak form, but this mesh is not required to meet the more rigorous standards demanded by finite elements, and hence, can be generated fairly easily. The present method determines the particle distribution, particle interactions, support size, and representative volume associated with each particle.

Determining representative volume is simple if one has a mesh. In the case without a mesh, the trouble is that one does not know how to account for the overlap of support functions. In the present method, the over-all volume does not affect the solvability of the moment matrix, just the relative volume. This is only a problem near the boundary, where a method estimates the fraction of contribution of the window function volume to be used. Then, once the geometry is defined, the total volume is computed from the analysis-suitable representation and is used to scale all the relative volumes initially found.

An exemplary application of the present invention involves learning the mechanics of the pelvic floor. The female pelvic floor muscles form a complex structure responsible for supporting the pelvic organs such as rectum, vagina, bladder, and uterus. These muscles and associated connective tissues are ultimately anchored to the bony pelvic scaffold, and play a major additional role in maintaining continence of urine and bowel contents. Additionally, these muscles and associated connective tissues allow for important physiologic activities like urination, defecation, menstrual flow, and biomechanical processes like childbirth and sexual intercourse.

The major components of the pelvic floor are highlighted in FIG. 2(a) and FIG. 2(b). A thorough description of the functional anatomy of the female pelvic floor can be found in [Ashton-Miller and DeLancey (2007)], [Hoyte and Damaser (2007)] and [Herschorn (2004)]. The levator ani muscle group, as shown in FIG. 2(b) is the ultimate supporting structure responsible for holding organs in the body, and is rightfully the main focus of most studies regarding pelvic floor dysfunction [Hoyte, Schierlitz, Zou, Flesh, and Fielding (2001)], [Venugopala Rao, Rubod, Brieu, Bhatnagar, and Cosson (2010)], [Lien, Mooney, DeLancey, and Ashton-Miller (2004)]. The vagina, shown in FIG. 2(c), is suspended across the pelvis and is anchored in large part to the levator ani, and less so to the Obturator internus muscles. The vagina, in turn, supports the bladder and works with the levator ani to keep the rectum in a position appropriate for fecal continence at rest and bowel evacuation when appropriate.

Many finite element studies have been produced of the levator ani muscles ranging from shell element models to full volume element models [Hoyte, Damaser, Warfield, Chukkapalli, Majumdar, Choi, Trivedi, and Krysl (2008)], [Martins, Pato, Pires, Jorge, Parente, and Mascarenhas (2007)], [Noritomi, da Silva, Dellai, Fiorentino, Giorleo, and Ceretti (2013)]. These models have been valuable tools in learning about the mechanics of the pelvic floor, but many of the models focus solely on the levator ani, without considering the interaction between the other pelvic structures.

To help address this deficit, focus is placed on the vagina for the examples herein. Since a mesh is required for finite element analysis, the geometry is often idealized, both due to the piece-wise polyhedral approximation and the need to adjust the points to create a quality mesh. The goal was to accurately represent the geometry and produced studies involving multi-component interactions. In [Doblaré, Cueto, Calvo, Martinez, Garcia, and Cegoñino (2005)], the prospects of performing mesh-free analysis for biomechanics problems are discussed with several Galerkin methods being described. They chose to use the natural element method, which is closely tied to Voronoi diagrams, on the basis that essential boundary conditions are easily applied. The ease of applying the essential boundary conditions comes at the cost of generating a mesh of the domain, though the authors say the mesh generation requires no interaction with the user. They showed successful examples involving mostly bony tissue and some cartilage. Mesh-free methods have been used successfully in other areas of biomechanics including the heart [Liu and Shi (2003)], and the brain [Horton, Wittek, Joldes, and Miller (2010)], [Miller, Horton, Joldes, and Wittek (2012)]. In a similar vein, a hybrid mesh-free-mesh-based method based on the Reproducing Kernel Element Method (RKEM) was undertaken in [Simkins, Jr., Kumar, Collier, and Whitenack (2007) and Jr., Collier, Juha, and Whitenack (2008)]. RKEM details can be found in [Liu, Han, Lu, Li, and Cao (2004). Li, Lu, Han, Liu, and Simkins, Jr. (2004), Lu, Li, Simkins, Jr., Liu, and Cao (2004) and Simkins, Jr., Li, Lu, and Liu (2004)].

Accordingly, what is needed is an efficient mesh-free method for producing an ASG from a discrete point set. The automated analysis capability is demonstrated in modeling vaginal contracture, as might occur in cases of women treated with radiation for cervical cancer. However, in view of the art considered as a whole at the time the present invention was made, it was not obvious to those of ordinary skill in the field of this invention how the shortcomings of the prior art could be overcome.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

While certain aspects of conventional technologies have been discussed to facilitate disclosure of the invention, Applicants in no way disclaim these technical aspects, and it is contemplated that the claimed invention may encompass one or more of the conventional technical aspects discussed herein.

The present invention may address one or more of the problems and deficiencies of the prior art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

BRIEF SUMMARY OF THE INVENTION

The long-standing but heretofore unfulfilled need for an efficient mesh-free method for producing an ASG from a discrete point set is now met by a new, useful, and nonobvious invention.

The present invention includes a method for efficiently building a digital ASG from a digital point set. The efficiency of building ASG models is an existing problem necessarily rooted in the realm of computational modeling and simulation. In other words, the present invention overcomes a problem specifically arising in the realm of computer modeling and simulating.

The novel method of creating an ASG from a discrete point set includes discretizing a set of points or receiving a set of points where the points are already discrete. From there, a smoothing length is computed at each discrete point and a representative volume at each discrete point is computed. A continuous geometry is then constructed via an implicit mathematical representation through a mesh free method, where constructing the continuous geometry includes a moment matrix invertible everywhere in a domain and quickly becomes linearly dependent as limits of the domain are approached.

In a certain embodiment, the method includes connecting multiple continuous geometries intended to interact during a simulation, wherein each continuous geometry represents a discrete point set and the connection is modeled after linear springs. The functionality of the multiple continuous geometries can then be simulated by applying loading conditions and boundary conditions to each continuous geometry being simulated. In a certain embodiment, the multiple continuous geometries are representative of anatomical structures.

In a certain embodiment, the constructed continuous geometry is an adequate description of the domain for placing RKPM analysis-suitable particles as warranted. In a certain embodiment, the decimated point set includes generating a regular grid of points and eliminating any points not in the domain.

These and other important objects, advantages, and features of the invention will become clear as this disclosure proceeds.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
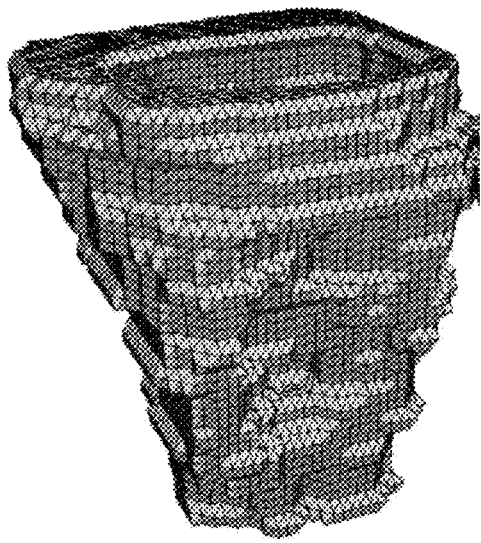
FIG. 1 is a finite element mesh of a vagina.

In the following detailed description of the preferred embodiments, reference is made to the accompanying drawings, which form a part thereof, and within which are shown by way of illustration specific embodiments by which the invention may be practiced. It is to be understood that other embodiments may be utilized and structural changes may be made without departing from the scope of the invention.

The present invention is applicable to any general point set in three-dimensional space. In order to process a generic discreet point set, the present invention computes a smoothing length at each discrete point and computes a representative volume at each discrete point. The smoothing length can be determined through nearest neighbor searches or any other approach known to a person having ordinary skill in the art.

One objective of the present invention is to scale the first continuous geometry so that the total volume of the mesh-free ASG has the same volume as the object to be modeled. Rarely does one have the ability to know the exact volume of the object being modeled, for example an organ inside a living human cannot practically be removed and carefully measured. Moreover, the discrete point set arising from a diagnostic device to represent an object does not intrinsically contain volume information, and being discrete, cannot fully capture enough information to contain the precise volume. For example, in medical imaging, such as MM or CT, the resulting images are easily converted to voxel models, with each voxel being a rectangular block. The volume of a voxel is easily computed, and all the voxels can be summed to come up with an approximate volume of the original object. Unless the original object is represented exactly by the voxel model, the voxel model is an imprecise representation of the object, and the total volume of the voxel model will also not be the true volume. Similar problems arise in other data sources, e.g. laser scan data. So, the best one can hope for is to come up with a model that is a useful representation of the shape, size and volume of the original object. The present invention is designed to be scaled to roughly the exact volume of the object, if the exact volume is known.

For that reason, the present invention uses the solvability of a moment matrix to define the geometry and assigns representative particle volumes without a mesh. The absolute volume represented by each particle, however, does not affect the solvability of the moment matrix, only the representative volumes. The invention exploits this fact to determine relative particle volumes based on the relative positioning of particles with respect to each other by computing the moment matrices and determining their solvability. This then defines the first continuous geometry that is precisely defined at this point. With the precise definition, the present invention can accurately compute the total volume of the first continuous geometry. This computed volume is the volume of the analysis-suitable geometry, but it may not be the same as the sum of the particle representative volumes. Thus, the particle representative volumes can be re-scaled so that their sum equals the total volume of the analysis-suitable geometry. How close the volume of the analysis-suitable geometry matches the exact volume of the object is subject to the un-certainty discussed in the paragraph above. For all intents and purposes, the volume of the ASG is generally the same as the actual object being modeled.

Once the smoothing length and the representative volume at each discrete point is computed, the proposed geometric model can be evaluated and the point set is an "analysis suitable model." This means that, through the geometric function, the point set can provide a complete description of the objects geometry and the point set can be used to approximate the functions necessary for engineering analysis, i.e. solution of partial differential equations and general geometric modeling. Further, once this analysis suitable model has been created from the initial point set, it can be used to generate subsequent analysis suitable models representing the same object using different point sets that are derived from the initial geometric model. This may include the actions of representing the object with a more dense set of points (refinement), representing the object with a more coarse set of points (coarsening), or refining some regions of the object while coarsening other regions of the object. Each subsequent point set representing the object can be processed as an analysis suitable model. This capability allows for easy control of the balance of model accuracy with computational efficiency.

The medical modeling example below is an exemplary application in which the smoothing length and representative volume are computed by taking advantage of the uniform nature of the pixel data. In a general sense, these quantities could be computed with algorithms that do not take advantage of the fact that the point set came from structured data. The medical modeling example also serves to show that the geometric model retains accuracy through coarsening. It is a specific example of coarsening; however any method of coarsening or refinement is considered by the present invention. The discussion relating to taking medical images and generating three-dimensional point sets through the creation of label-maps and extracting points is for completeness and background.

Reproducing Kernel Particle Method

The Reproducing Kernel Particle Method (RKPM) is a mesh-free method in the general class of so-called Meshfree Galerkin methods, which includes other methods such as the Element Free Galerkin (EFG) method. The general process described herein is applicable to many of the mesh-free methods, though RKPM is reviewed here for completeness. The general formulation is available in a number of papers and texts, such as [Li and Liu (2002) and Liu, Jun, and Zhang (1995)]. The approach presented here is that of [Li and Liu (2004)].

The problem domain is discretized by a collection of particles, each representing a certain volume and mass of material. A function $f$ defined on the domain is approximated by an expression $$\iota f(x) = \int_{\Omega} K_\rho(x-y,x)f(y)dy \qquad \text{Eq 1}$$

where $K_\rho$ is a smooth kernel function, and $\iota$ is an approximation operator. In RKPM, the form of the kernel is chosen to be $$K_\rho(x-y, x) = P^T\left(\frac{x-y}{\rho}\right)b(x)\Phi(x-y; \rho) \qquad \text{Eq 2}$$

The parameter $\rho$ is called the smoothing length and is the characteristic length scale associated with each particle. The window function $\Phi$ is a non-negative, smooth function that is compactly supported with support radius of length $\rho$. The vector P contains the monomial terms of a polynomial of some order. In the present work, a tri-linear basis is used, so $$P^T(x) = [1\ x\ y\ z\ xy\ yz\ zx\ xyz] \qquad \text{Eq 3}$$

Finally, the vector b, termed the normalizer, is computed at each evaluation point as a correction function to enforce consistency conditions on the approximation. The consistency conditions lead to a set of equations $$\left.\begin{aligned}\sum_I K_\rho(x-x_I, x)\Delta x_I &= 1 \\ \sum_I \left(\frac{x-x_I}{\rho}\right)K_\rho(x-x_I, x)\Delta x_I &= 0 \\ \sum_I \left(\frac{y-y_I}{\rho}\right)K_\rho(x-x_I, x)\Delta x_I &= 0 \\ \sum_I \left(\frac{z-z_I}{\rho}\right)K_\rho(x-x_I, x)\Delta x_I &= 0 \\ &\vdots \\ \sum_I \left(\frac{x-x_I}{\rho}\right)^\alpha K_\rho(x-x_I, x)\Delta x_I &= 0\end{aligned}\right\} \qquad \text{Eq 4}$$

where a is a multi-index with $\|\alpha\|=n$. Upon substituting Eq. 2, leads to the following set of linear equations $$\begin{pmatrix} m_0(x) & m_1(x) & \ldots & m_n(x) \\ m_1(x) & m_2(x) & \ldots & m_{n+1}(x) \\ \vdots & \vdots & \vdots & \vdots \\ m_n(x) & m_{n+1}(x) & \ldots & m_{2n}(x) \end{pmatrix}\begin{pmatrix} b_0(x) \\ b_1(x) \\ \vdots \\ b_n(x) \end{pmatrix} = \begin{pmatrix} 1 \\ 0 \\ \vdots \\ 0 \end{pmatrix} \qquad \text{Eq 5}$$

Or, $M(x)b(x)=P(0)$. The individual entries $m_i(x)$ are computed from $$m_i = \sum_I \left(\frac{x-x_I}{\rho}\right)^i \Phi\left(\frac{x-x_I}{\rho}\right)\Delta V_I \qquad \text{Eq 6}$$

The system Eq. 5 is called the moment equation whose solution yields the values for the normalizer $b(x)$. The present work is based upon the observation that the actual domain is defined where the moment matrix is non-singular. Conversely, where the moment matrix is singular, there is no body.

Example of the Method

Readily available programs, such as the 3D Slicer, can read the data generated by the imaging machines, convert the images to point clouds, and generate meshes. This is not quite a satisfactory result because the resulting images, while visually appealing, do not stand up under the scrutiny required for analysis. In particular, the meshes generally have duplicate points, edges, and faces; holes and discontinuities; and topological variations such as intersecting faces. The first of these problems can easily be rectified, but the latter problems generally require manual intervention to guide software in repairing the mesh. Mesh-free Galerkin methods build their function spaces directly from point sets, and thus are not plagued by the same issues as mesh-based methods. This feature makes mesh-free methods attractive for life science applications.

Figure 3:
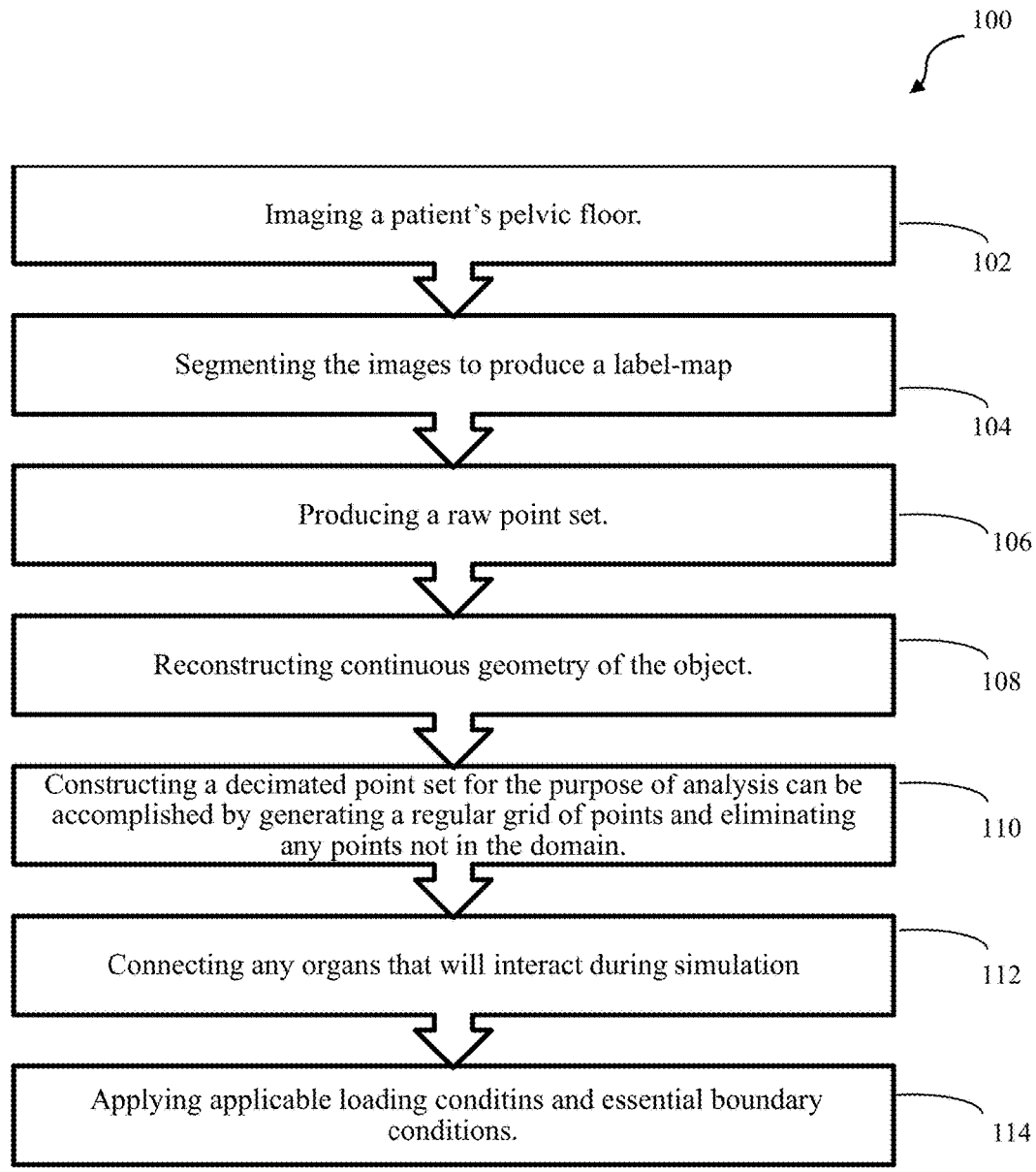
FIG. 3 is a flowchart of a certain embodiment of the present invention.
Figure 4:
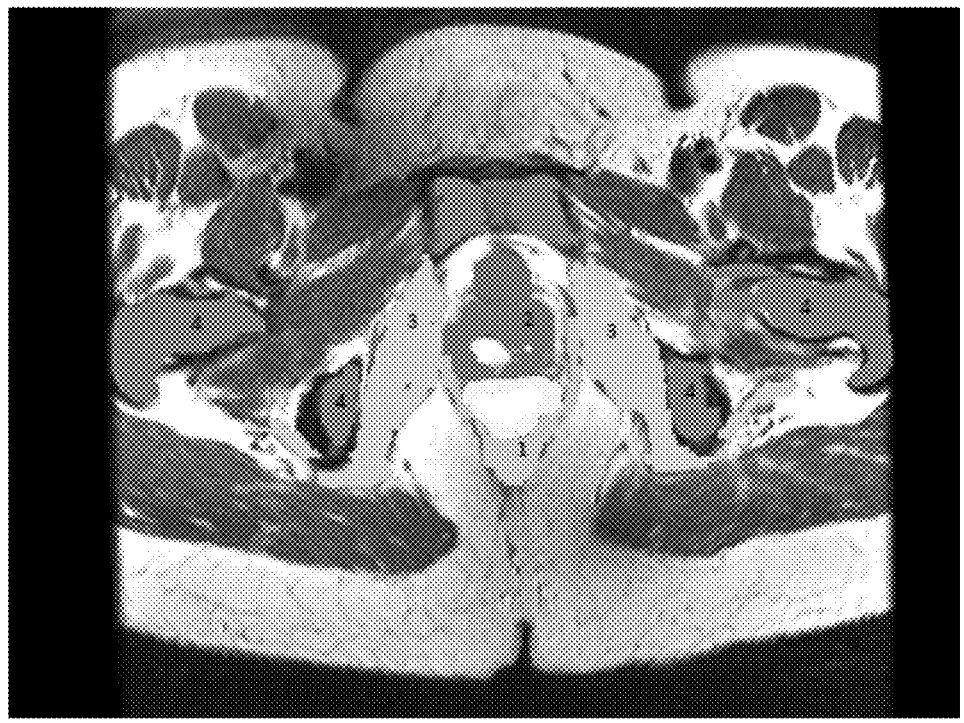
FIG. 4 is a labeled image of the female pelvic floor showing (1) Levator ani, (2) Vagina, (3) Obturator, (4) Pelvis.

The basic approach, generally denoted by reference numeral 100 and shown in FIG. 3, is exemplified in the creation of a patient-specific modeling of the pelvic floor. A patient specific model is created by first producing a sequence of images of the pelvic floor via some imaging tool such as magnetic resonance imaging (MM), step 102. In these raw images, the various organs and tissues are not distinguished. The images must be segmented to segregate the organs into individual models, step 104. The resulting image, as provided in FIG. 4, is called a label-map. Automatic segmentation is an open research topic, currently the images are at least partially segmented by hand. Some methods for segmenting the pelvic floor are discussed in [Ma, Jorge, Mascarenhas, and Tavares (2012)]. After the label-maps are generated, the discrete point set representations of the models are produced. The label-maps are integer arrays with each index referring to a pixel, or color value. Each pixel is representative of an area with pre-defined dimensions. When the label-maps are stacked, the space between consecutive images is represented with voxels, or volume elements. The voxels are transformed into the raw point set in $R^3$ based on their dimensions and location in image space, step 106. The raw point set is then used to reconstruct the continuous geometry of the object via an implicit representation described in the "Geometric Description" section below, step 108. The reconstructed geometry is an adequate description of the domain that is useful for placing RKPM analysis suitable particles as warranted. The geometric model defines the surface and interior of the object (volume). It is up to a practitioner to discretize the geometric model with particles (or elements) in a way that is valid for the type of analysis the practitioner is attempting to produce. This may be accomplished through an appropriate algorithm that evaluates the geometric model to determine if a point is on the surface or interior of the object, then calculates any necessary properties of the point required for the analysis. One useful method would be to determine a desired spacing of points for the model, generate a regular grid of points using that spacing, then use the existing geometric model derived from the initial point set to filter out points that are not inside the body nor on its boundary. The remaining points can then be used to generate a new geometric representation using the same algorithm used on the initial input point set. This, however, is only one possible method for coarsening or refinement. The geometric model derived from the initial point set can be used as a standard to judge any attempted refinement or coarsening.

Figure 5A:
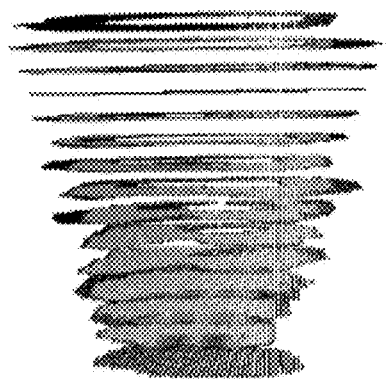
FIG. 5(a) is a raw point set from label-maps with 37,376 points.
Figure 5B:
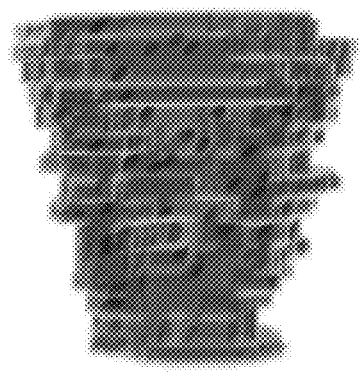
FIG. 5(b) is a volume reconstruction from the raw points set in FIG. 5(a).
Figure 5C:
FIG. 5(c) decimated point set having 16,119 points.

For the example in FIG. 3, the discretization included constructing a decimated point set for the purpose of analysis by generating a regular grid of points and eliminating any points not in the domain, step 110. FIG. 5 shows the sequence of progression from the raw point set in FIG. 5(*a*) to the volume reconstruction shown in FIG. 5(*b*), and then to the decimated point set in FIG. 5(*c*). The idea is that the discretization may be accomplished, very simply, by generating a grid of points and evaluating each point with the geometric model to determine which points are inside the object. This algorithm may be used to produce a coarse discretization—fewer points than originated in the voxel model, it may be used to produce a refined model—more points than originated in the voxel model, or it may be used to discretize the object in a way that results in some local regions being represented with a coarse discretization and other regions being represented with a refined discretization.

Once all of the organs of interest are processed and have their final points placed in their respective domains, any organs that will interact during the simulation must be connected, step 112. The current method is to model connective tissue as linear springs between organs. After the organs are connected any applicable loading conditions and essential boundary conditions are applied, step 114 and the performance of the organs can be simulated and analyzed.

Geometric Description

The initial geometry is obtained from a discrete point set, thus the continuous geometry must be reconstructed. As discussed earlier, the moment matrix in Eq. 5 is non-singular inside of the domain. The linear dependence of the moment equations is based largely on the number of particles in the support and the spatial distribution of these particles. If properly constructed, the moment matrix is well-conditioned and invertible everywhere in a domain. The moment equations quickly become linearly dependent as the limits of the domain are approached. This fact was used to build a function to describe the geometry implicitly. In numerical linear algebra, the condition number of a matrix is a measure of "how singular" a matrix is. The condition number is defined in [Saad (2003)] as $$\kappa(A):=\|A\|\|A^{-1}\|, \kappa\in[1,+\infty)$$  Eq 7

The best-conditioned matrix has K=1, a singular matrix has $\kappa\to\infty$. Therefore the geometry was defined based on the condition number of the system of equations:

$$F(x)=\kappa(M(x))^{-1}$$  Eq 8 where M(x) is the moment matrix at a point and k, is a function returning the condition. Notice that in Eq. 8 the reciprocal condition number is used and the range of the function is (0;1], with $\kappa^{-1}=0$ indicating a singular matrix. Then the reconstructed domain is defined as:

1. $\text{int}(\Omega_\varepsilon):=\{x\in R^n|\varepsilon<F(x)<1\}$

2. $\partial(\Omega_\varepsilon):=\{x\in R^3|F(x)=\varepsilon\}$

3. $\{R^3-\overset{\circ}{\Omega}_\varepsilon\}:=\{x\in R^n|F(x)<\varepsilon\}$  Eq 9 where 1 is the interior, 2 is the boundary of the domain and ε is small. With this definition, the boundary of the domain is defined as a contour of Eq. 8. The shape of the reconstructed boundary can be controlled through the radius of support. As the support radius grows any surface features are smoothed over, conversely as the support radius is decreased any surface features become more sharply defined.

Figure 2A:
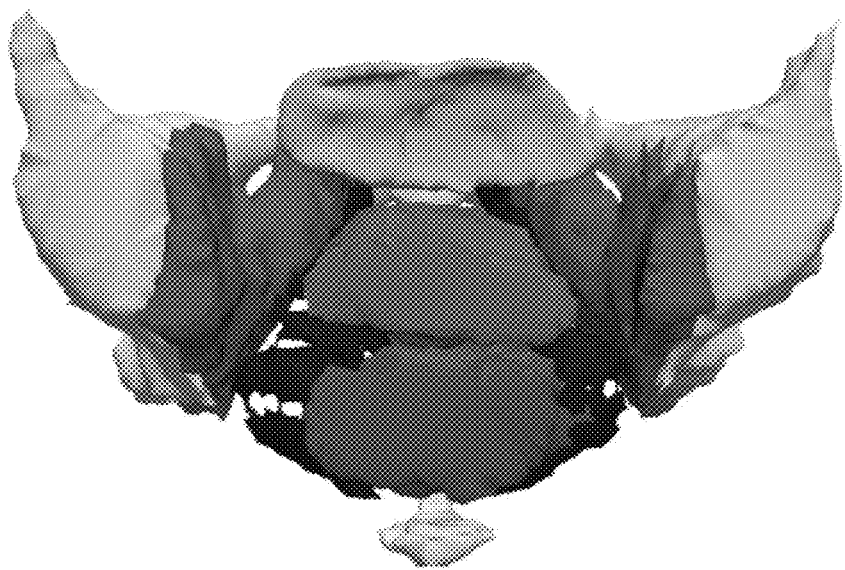
FIG. 2(a) is an image of the major pelvic organs found in a female's pelvic floor.
Figure 2B:
FIG. 2(b) is an image of the major pelvic muscles found in a female's pelvic floor.
Figure 2C:
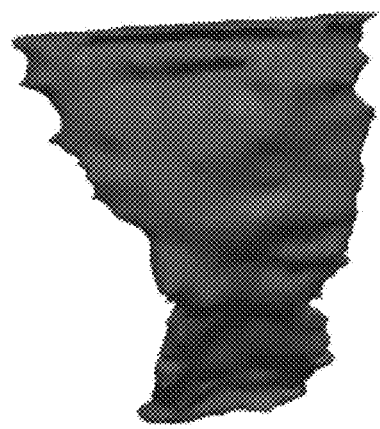
FIG. 2(c) is an image of a vagina.
Figure 6:
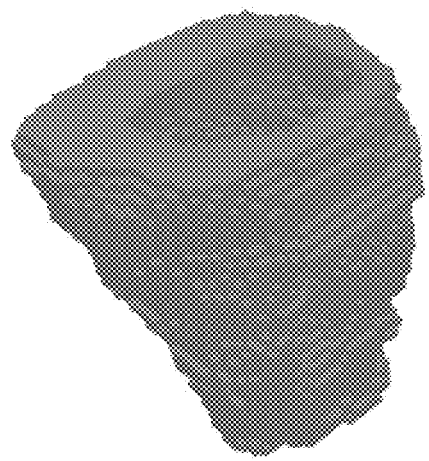
FIG. 6 is a voxel mesh representation of the vagina.

The set of points derived from the image $X_I$, are the discrete representation of the domain, Ω. Developing a mesh-free function space directly from a general point set is a non-trivial task due to the need for accurate integration weights and support radius. The set of points can actually be thought of as the vertices of a hexahedral mesh that is usually referred to as the voxel model. Appropriate representative particle volume $\Delta V_I$, and support radius p can be assigned using data from the voxel elements. Due to aliasing artifacts, the voxel mesh is not suitable for representing the smooth geometry of biological tissue, and it could not generate a smooth solution to the PDE's if used for a finite element model. Yet, by using the vertices to construct a mesh-free representation of the geometry, the representation is smooth. The objects of interest in the pelvic floor are smooth, not rough. One critique of the proposed method is that it may not represent the actual geometry precisely enough. On the other hand, a voxel mesh, as in FIG. 6, is clearly not a smooth body, and itself is inaccurate due to the aliasing and rough discretization inherent in a digital medical image. Refer back to FIG. 2(*c*) for an example of a smooth representation.

In order to illustrate this definition of the geometry, a one-dimensional example is plotted over a unit domain. The domain is discretized with ten particles and their integration weights are assigned as described in [Li and Liu (2004)]. The particles are uniformly distributed throughout the domain, so a suitable support radius is defined as $$\rho=\alpha\Delta x$$  Eq 10 where Δx is the particle spacing and a is the dilation coefficient. The shape functions and the corresponding geometry representation are shown for dilation coefficient values of 1.2, 1.4, and 1.6. The dashed vertical lines in FIG.

Figure 7A:
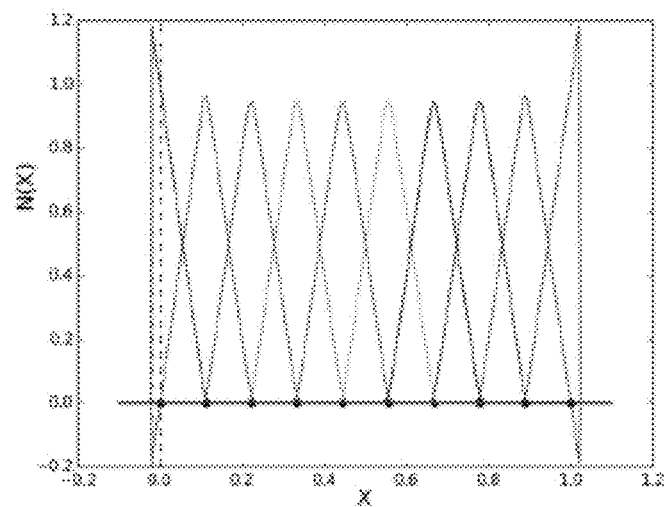
FIG. 7(a) is a graph of a one-dimensional shape function with $\alpha=1.2$.
Figure 7B:
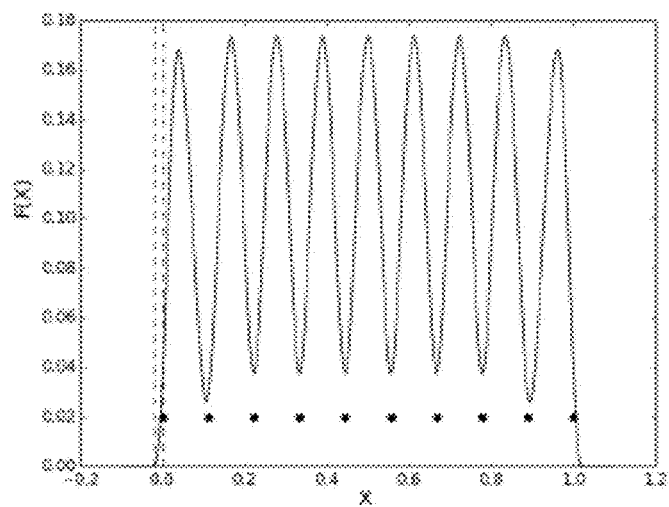
FIG. 7(b) is a graph of reciprocal condition numbers with $\alpha=1.2$.
Figure 7C:
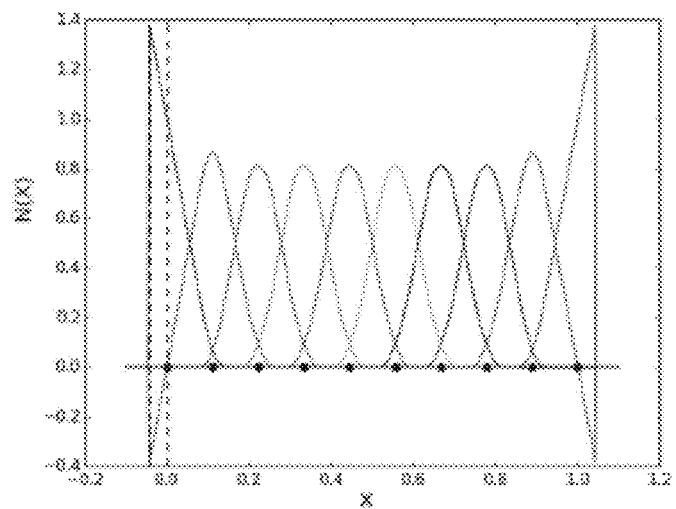
FIG. 7(c) is a graph of a one-dimensional shape function with $\alpha=1.4$.
Figure 7D:
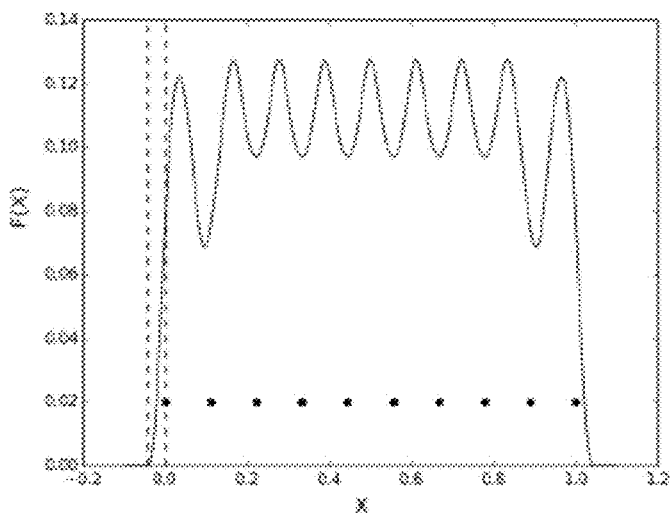
FIG. 7(d) is a graph of reciprocal condition numbers with $\alpha=1.4$.
Figure 7E:
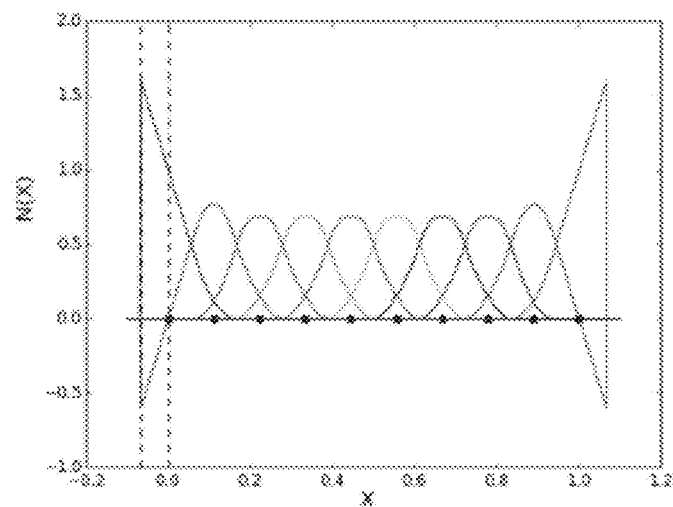
FIG. 7(e) is a graph of a one-dimensional shape function with $\alpha=1.6$.
Figure 7F:
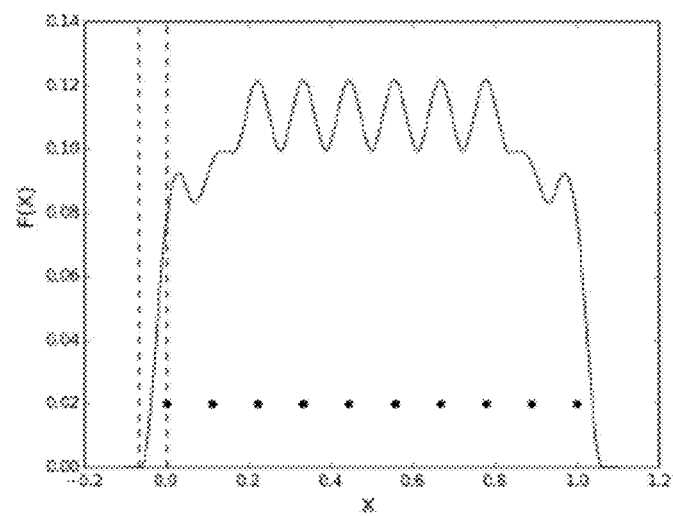
FIG. 7(f) is a graph of reciprocal condition numbers with $\alpha=1.6$.
Figure 8:
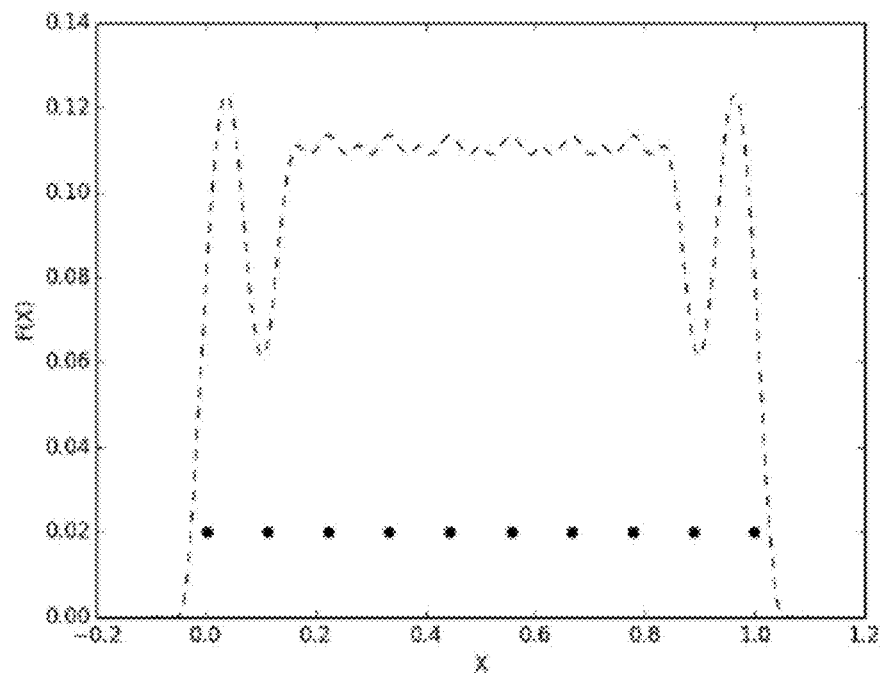
FIG. 8 is a graph showing reciprocal condition number: boundary particles $\alpha=1.2$, interior particles $\alpha=1.5$.

7 are bounds for the area starting at the first boundary particle and extending out until the moment matrix is singular to machine precision. This area will be referred to as the rind of the reconstructed domain. Notice that as the dilation coefficient is increased this rind grows in size. This would correspond to a smoothing of geometric features, which may or may not be desirable. The shape functions plotted in FIG. 7 show the correlation between support coverage and moment matrix condition. As a reminder, the moment matrix is computed via nodal integration, each term in the summation is a rank one matrix representative of a particle's contribution. If this integral is dominated by a single term, the overall condition of the moment matrix is poor. Conversely, when each of the terms is equally weighted, the moment matrix is well conditioned. This shows up in FIG. 7(b), FIG. 7(d), and FIG. 7(f) as the fluctuations in F(x). In FIG. 7(b), these fluctuations are much greater than in the FIG. 7(d) and FIG. 7(f). The peaks are higher between particles, indicating a well-conditioned moment matrix and no dominating term in the integral. Additionally, the valleys are much lower at a particle, indicating a poorly conditioned moment matrix and thus one term in the integral is dominating. Since the surface was chosen based on some threshold value F(x)=ε, these fluctuations could cause trouble if the functions falls below c in an undesirable location. This could result in holes in the domain where none exist. A safe method for representing sharp surface features, meaning using a small value for a, is to increase the dilation coefficient of internal particles while keeping the boundary particle dilation coefficients the same as in FIG. 8. This method minimizes the size of the rind, while smoothing the fluctuations in F(x). Increasing the number of particles in the domain would also remedy this problem, yet simply controlling the dilation parameter provided the same effect without adding more degrees of freedom.

Example in 3D

Figure 9A:
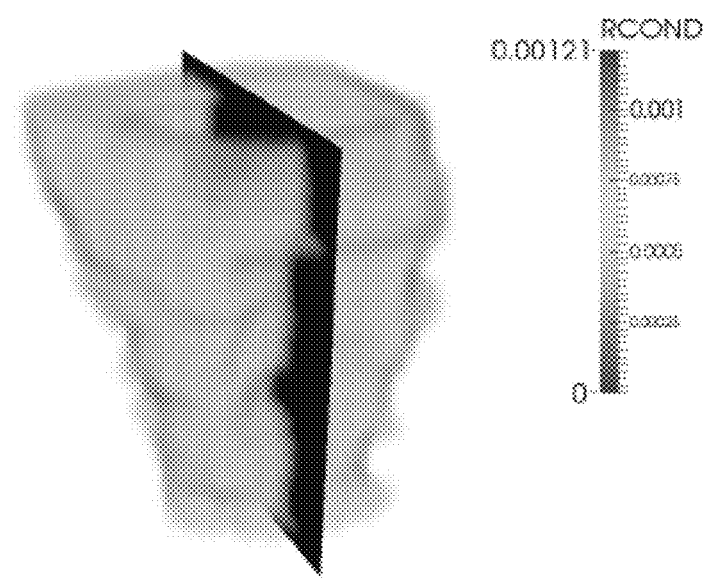
FIG. 9(a) is a volume rendering of the vagina with a plane slicing through the model.
Figure 9B:
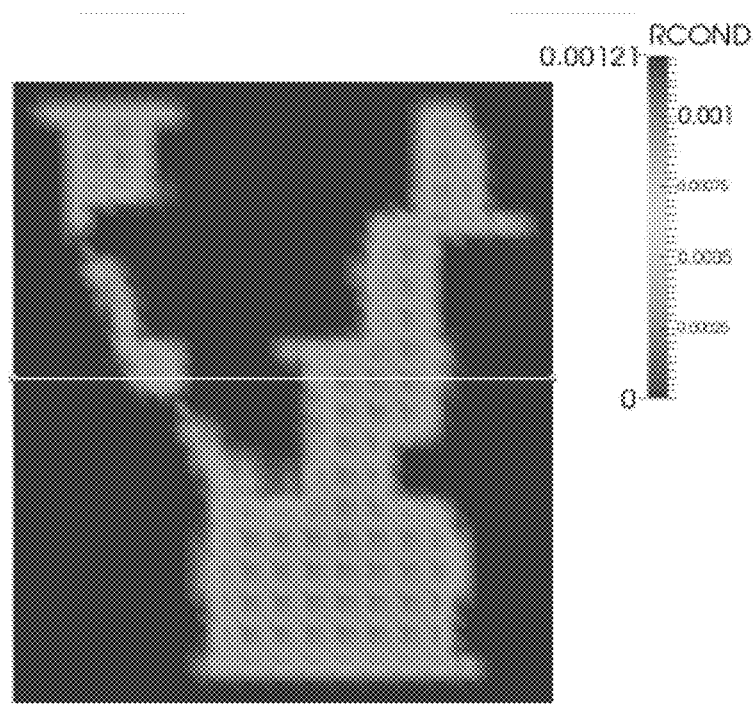
FIG. 9(b) is a two-dimensional plot of the plane in FIG. 8(a).
Figure 9C:
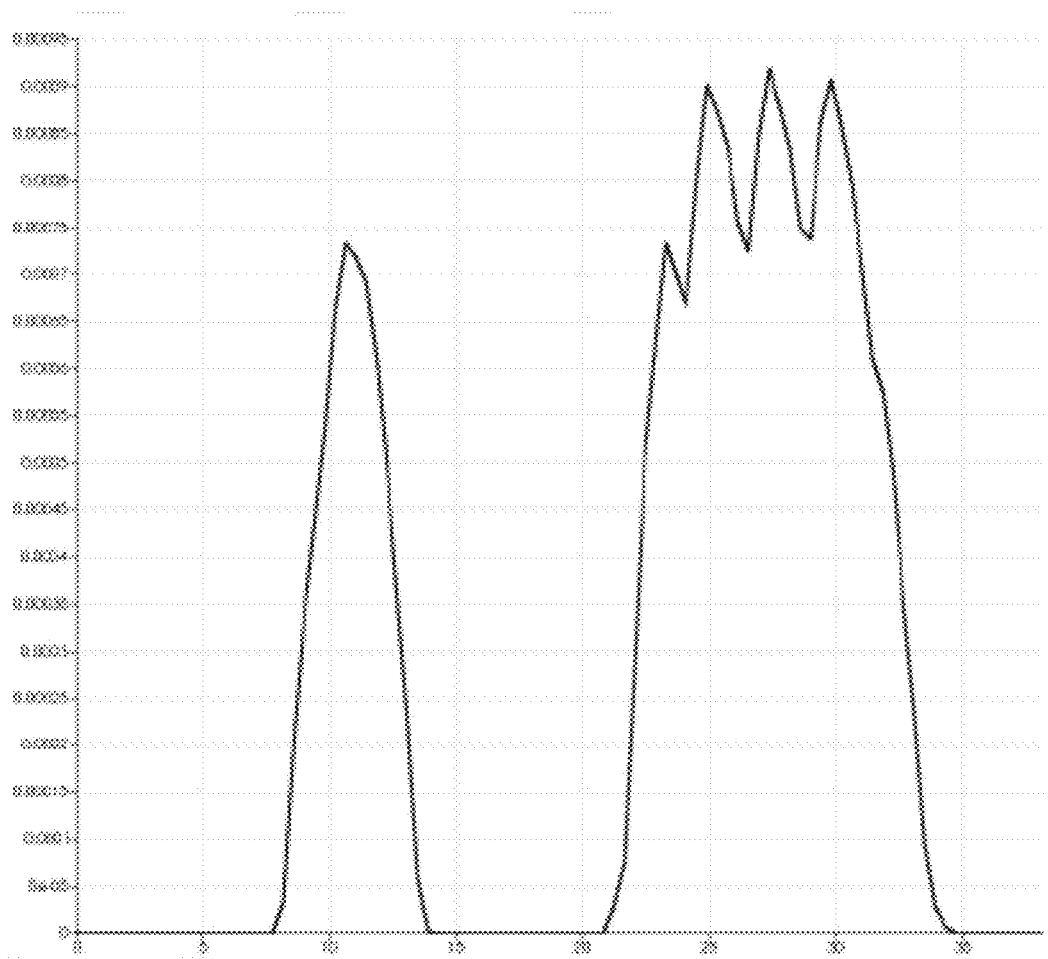
FIG. 9(c) is line plot of the plane in FIG. 8(a).

The ideas discussed in one dimension hold true for three-dimensional models. A volume rendering of the vagina is shown in FIG. 9(a), the plane slicing through the model shows the location of the plot in FIG. 9(b). FIG. 9(c) shows the moment matrix reciprocal condition number is then plotted over the line drawn across the middle of FIG. 9(b). The top portion of the model is essentially a thin walled tube, and this shows up in the line plot across the body as two peaks in the function. The second peak shows the same fluctuations that were discussed in the one-dimensional example.

Figure 10A:
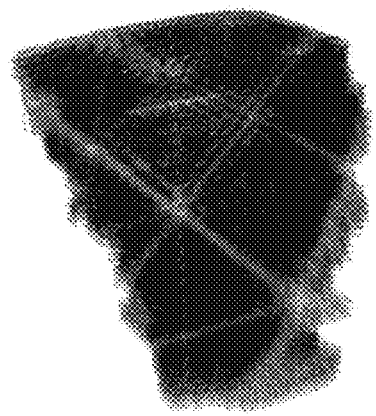
FIG. 10(a) is a representation of a vagina derived directly from a medical image, wherein the representation has 112,128 particles.
Figure 10B:
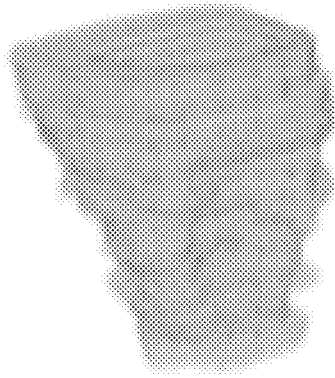
FIG. 10(b) is a volume rendering of FIG. 10(a).
Figure 10C:
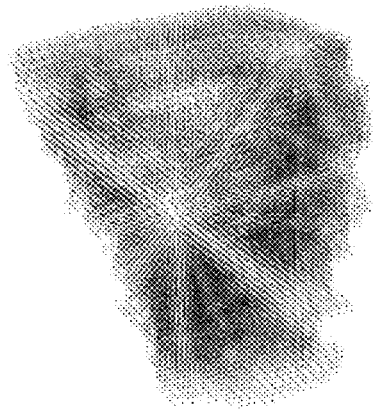
FIG. 10(c) is raw point representation of the vagina decimated to 26,809 particles.
Figure 10D:
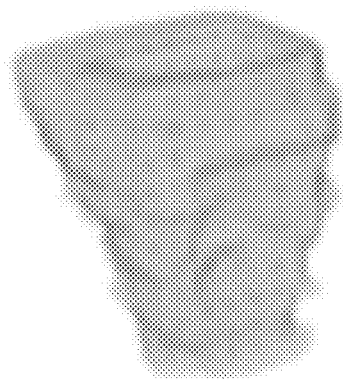
FIG. 10(d) is a volume rendering of FIG. 10(c).
Figure 10E:
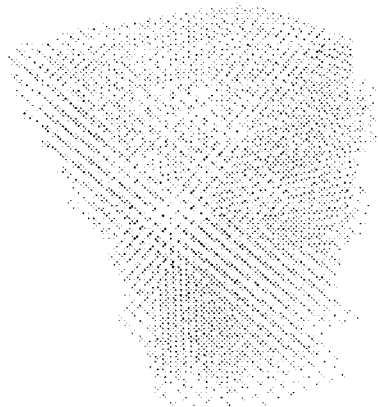
FIG. 10(e) is a representation having 3,339 particles.
Figure 10F:
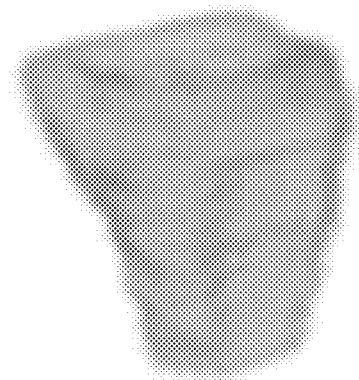
FIG. 10(f) is a volume rendering of FIG. 10(e).
Figure 11:
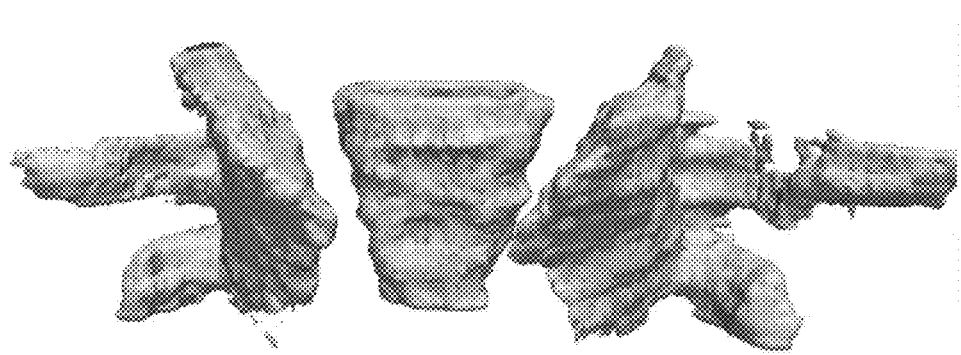
FIG. 11 is an image showing the original configuration of a vagina model.

In order to perform an analysis in an efficient manner, it is important to limit the number of particles in the model. Since the goal of the method is to maintain patient specific features in the model, decimation of the model cannot significantly alter the geometry being represented. The images in FIG. 10 depict the volume renderings for three different particle sets. The first representation, FIG. 10(a), with 112,128 particles, is derived directly from a medical image. The volume rendering of this representation, FIG. 10(b), has well defined features such as the indentation of the front wall and the ridges along the sidewalls. The raw point representation was decimated to 26,809 particles, as shown in FIG. 10(c). The volume rendering for this representation, FIG. 10(d) still has the well-defined indentation and the ridges on the sidewall are still defined. The third representation in FIG. 10(e) has a particle count of 3,339. While this representation retained the overall shape of the original model, the indentation on the front wall and the ridges on the sidewall are not as well defined, as shown in the volume rendering of FIG. 10(f). The tetrahedral Finite Element mesh in FIG. 11 shows some of the same geometric features as the inventive volume reconstructions, yet the surface is not smooth. As evidenced in the foregoing, a highly coarse discretization still results in a geometric model that maintains many patient specific features.

Application Example

Mechanical deformation of tissues in the female pelvic floor is believed to be central to understanding a number of important aspects of women's health, particularly pelvic floor dysfunction. A 2008 study of US women reported the prevalence of pelvic floor disorders in the 20 and 39 years range as 9.7% with the prevalence increasing with age until it reaches roughly 50% in the 80 and older age group [Nygaard, Barber, Burgio, et al (2008)]. Clinical observation indicates a strong correlation between problems such as pelvic organ prolapse/urinary incontinence and vaginal childbirth. It is thought that childbirth parameters like fetal weight, duration of labor, and pelvic bony and soft tissue geometry can modulate the level of injury sustained during childbirth. However, it is difficult to study the impact of childbirth parameters non-destructively in living women. Therefore, realistic, efficient, computational modeling capabilities are necessary to study the mechanical response of the organs and muscles during childbirth under varying conditions, in order to develop and test hypotheses for childbirth related injury. Furthermore, manufacturers of embedded prosthetic devices, such as those used to treat prolapse, may benefit from the ability to predict the mechanical performance of their prostheses in situ, and this potential benefit highlights the need for a capability to rapidly develop analytical models of the pelvic floor.

A computer simulation was developed to perform virtual studies of mechanical problems involving the pelvic floor. Ultimately, the goal is to provide an automatic, or nearly automatic, process to perform engineering analysis on objects defined by medical images. Vaginal contraction was chosen as the first test case because it is simpler than a full childbirth simulation, yet has direct relevance to actual medical procedures, and involves all aspects of the computational problems sought to be addressed by the invention. Vaginal contraction is a long-term side effect of pelvic radiation therapy and is caused by the development of scar tissue. This scar tissue results in a shortening and narrowing of the vagina and has associated difficulties and treatments as described in [Bruner, Lanciano, Keegan, Corn, Martin, and Hanks (1993)] and [Decruze, Guthrie, and Magnani (1999)].

Figure 12:
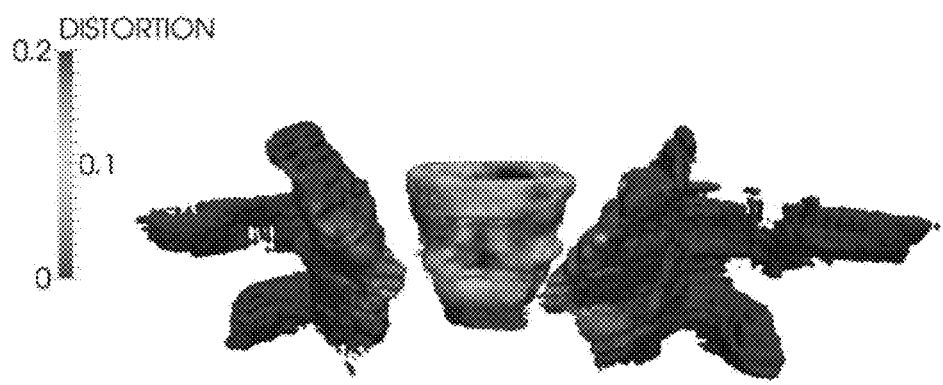
FIG. 12 is an image showing a distortional strain plotted on the final configuration of the vagina model.

For the present study, the vagina, obturator, and pelvis are the organs under consideration. In order to model vaginal contraction, a −2.5% strain was applied to the vagina over a series of seven static load steps, leading to a large overall decrease in width and length. The lateral vaginal wall was attached to the Obturator internus via linear springs, and the Obturator internus was anchored to the pelvic bones via essential boundary conditions. For simplicity, the cervix was modeled as a fixed rigid body and the vagina was connected to it via linear springs. The organs were discretized with 16119, 17691, and 18553 particles for the vagina, left obturator, and right obturator, respectively. The original non-deformed configuration is shown in FIG. 1. The distortional strain is plotted on the final configuration in FIG. 12.

An algorithm for completely automated generation of analysis-suitable geometries from discrete point sets was presented. The method appears to work well on organs found in the female pelvic floor and comparisons were made to voxel mesh geometries. Finally, to demonstrate that the resulting geometry is analysis-suitable, a simulation of vaginal contracture was performed and presented using the geometry representation from the algorithm.

Glossary of Claim Terms

Discrete Point Set: is a set of distinct and separate points.
Galerkin Method: is a method for solving partial differential equations based on the weak form.
Mesh free Galerkin Method: a Galerkin method based on a mesh free function space.
Representative Volume: is a portion of volume of a domain that is represented by a particle. The representative volume multiplied by the mass density gives the mass associated with the particle.
Smoothing Length: is the characteristic length associated with a particle to determine if a point in the domain is influenced by the particle.

REFERENCES

Ashton-Miller & DeLancey, (2007): Functional anatomy of the female pelvic floor. Annals of the New York Academy of Sciences, vol. 1101, no. 1, pp. 266-296.
Baghdadi, et al. (2005): Template-based finite-element mesh generation from medical images. Computer Methods and Programs in Biomedicine, vol. 77, no. 1, pp. 11-21.
Bruner, et al. (1993): Vaginal stenosis and sexual function following intracavitary radiation for the treatment of cervical and endometrial carcinoma. International Journal of Radiation Oncology*Biology*Physics, vol. 27, no. 4, pp. 825-830.
Bucki, et al. (2010): A fast and robust patient specific finite element mesh registration technique: Application to 60 clinical cases. Medical Image Analysis, vol. 14, no. 3, pp. 303-317.
Decruze, et al. (1999): Prevention of vaginal stenosis in patients following vaginal brachytherapy. Clinical Oncology, vol. 11, no. 1, pp. 46-48.
Doblaré, et al. (2005): On the employ of meshless methods in biomechanics. Computer Methods in Applied Mechanics and Engineering, vol. 194, no. 68, pp. 801-821.
Herschorn, (2004): Female pelvic floor anatomy: the pelvic floor, supporting structures, and pelvic organs. Reviews in urology, vol. 6, no. Suppl 5, pp. S2.
Horton, et al. (2010): A meshless Total Lagrangian explicit dynamics algorithm for surgical simulation. Int'l J for Numerical Methods in Biomedical Engineering, vol. 26, no. 8, pp. 977-998.
Hoyte, & Damaser, (2007): Magnetic resonance-based female pelvic anatomy as relevant for maternal childbirth injury simulations. Annals of the New York Academy of Sciences, vol. 1101, pp. 361.
Hoyte, et al. (2008): Quantity and distribution of levator ani stretch during simulated vaginal childbirth. American Journal of Obstetrics and Gynecology, vol. 199, no. 2, pp. 198.e1—198.e5.
Hoyte, et al. (2001): Two- and 3-dimensional mri comparison of levator ani structure, volume, and integrity in women with stress incontinence and prolapse. American Journal of Obstetrics and Gynecology, vol. 185, no. 1, pp. 11-19.
Jr., D. C. S.; Collier, N.; Juha, M.; Whitenack, L. B. (2008): A framework for studying the rkem representation of discrete point sets. In Griebel, M.; Schweitzer, M. A. (Eds): Meshfree Methods for Partial Differential Equations IV, volume 65 of Lecture Notes in Computational Science and Engineering, pp. 301-314, Berlin.
Li & Liu, (2002): Meshfree and particle methods and their applications. Applied Mechanics Review, vol. 55, no. 1, pp. 1-34.
Li & Liu, (2004): Meshfree Particle Methods. Springer, Berlin.
Li, et al. (2004): Reproducing kernel element method, Part II. Global conforming Im/Cn hierarchy. Computer Methods in Applied Mechanics and Engineering, vol. 193, pp. 953-987.
Lien, et al. (2004): Levator ani muscle stretch induced by simulated vaginal birth. Obstet Gynecol., vol. 103(1), pp. 31-40.
Liu & Shi, (2003): Meshfree representation and computation: Applications to cardiac motion analysis. In Taylor, C.; Noble, J. (Eds): Information Processing in Medical Imaging, volume 2732 of Lecture Notes in Computer Science, pp. 487-498. Springer Berlin Heidelberg.
Liu, et al. (1995): Reproducing kernel particle methods. International Journal for Numerical Methods in Fluids, vol. 20, pp. 1081-1106.
Liu, et al. (2004): Reproducing kernel element method: Part I. Theoretical formulation. Computer Methods in Applied Mechanics and Engineering, vol. 193, pp. 933-951.
Lu, et al. (2004): Reproducing kernel element method Part III. Generalized enrichment and applications. Computer Methods in Applied Mechanics and Engineering, vol. 193, pp. 989-1011.
Ma, et al. (2012): Segmentation of female pelvic cavity in axial t2-weighted mr images towards the 3d reconstruction. International Journal for Numerical Methods in Biomedical Engineering, vol. 28, no. 6-7, pp. 714-726.
Martins, et al. (2007): Finite element studies of the deformation of the pelvic floor. Annals of the New York Academy of Sciences, vol. 1101, no. 1, pp. 316-334.
Miller, et al. (2012): Beyond finite elements: A comprehensive, patient-specific neurosurgical simulation utilizing a meshless method. Journal of Biomechanics, vol. 45, no. 15, pp. 2698-2701.
Noritomi, et al. (2013): Virtual modeling of a female pelvic floor and hypothesis for simulating biomechanical behavior during natural delivery. Procedia {CIRP}, vol. 5, no. 0, pp. 300-304. <ce:title>First {CIRP} Conference on BioManufacturing</ce:title>.
Nygaard, et al. (2008): Prevalence of symptomatic pelvic floor disorders in us women. The Journal of the American Medical Association, vol. 300, no. 11, pp. 1311-1316.
Saad, (2003): Iterative Methods for Sparse Linear Systems: Second Edition. Society for Industrial and Applied Mathematics (SIAM, 3600 Market Street, Floor 6, Philadelphia, Pa. 19104).
Salo, et al. (2013): Evaluation of mesh morphing and mapping techniques in patient specific modeling of the human pelvis. International Journal for Numerical Methods in Biomedical Engineering, vol. 29, no. 1, pp. 104-113.
Simkins, et al. (2007): Geometry representation, modification and iterative design using RKEM. Computer Methods in Applied Mechanics and Engineering, vol. 196, pp. 4304-4320.
Simkins, et al. (2004): Reproducing kernel element method Part IV. Globally compatible $C^n(n \geq 1)$ triangular hierarchy. Computer Methods in Applied Mechanics and Engineering, vol. 193, pp. 1013-1034.

Venugopala Rao, G.; Rubod, C.; Brieu, M.; Bhatnagar, N.; Cosson, M. (2010): Experiments and finite element modelling for the study of prolapse in the pelvic floor system. Computer Methods in Biomechanics and Biomedical Engineering, vol 13, no. 3, pp. 349-357. PMID: 20099169.

In the preceding specification, all documents, acts, or information disclosed does not constitute an admission that the document, act, or information of any combination thereof was publicly available, known to the public, part of the general knowledge in the art, or was known to be relevant to solve any problem at the time of priority.

The disclosures of all publications cited above are expressly incorporated herein by reference, each in its entirety, to the same extent as if each were incorporated by reference individually.

While there has been described and illustrated specific embodiments of a method of modeling vaginal anatomy, it will be apparent to those skilled in the art that variations and modifications are possible without deviating from the broad spirit and principle of the present invention. It is also to be understood that the following claims are intended to cover all of the generic and specific features of the invention herein described, and all statements of the scope of the invention, which, as a matter of language, might be said to fall therebetween.

What is claimed is:

1. A method of creating an analysis-suitable geometry from a discrete point set, comprising:
    obtaining a digital point set, wherein the digital point set includes a point located internal to an outer surface of an object to be modeled;
    discretizing the digital point set;
    computing a smoothing length at each discrete point;
    automatically computing a representative volume at each discrete point using the solvability of a moment matrix;
    constructing a first continuous geometry via an implicit mathematical representation through a mesh free method; and
    computing a total volume of the first continuous geometry and scaling the representative volumes at each discrete point to adjust the total volume of the first continuous geometry.

2. The method of claim 1, wherein the constructing a first continuous geometry further includes defining and evaluating a mesh free function space and refining or coarsening the first continuous geometry.

3. The method of claim 1, further including connecting the first continuous geometry with a second continuous geometry, wherein the first and second continuous geometries interact during a simulation and each continuous geometry represents a discrete point set and the connection is modeled after linear springs.

4. The method of claim 3, further including simulating functionality of the first continuous geometry and the second continuous geometry by applying loading conditions and boundary conditions to each being simulated.

5. The method of claim 3, wherein the first and second continuous geometries are representative of anatomical structures.

6. The method of claim 1, wherein the moment matrix is invertible everywhere in a domain and becomes linearly dependent as limits of the domain are approached.

7. The method of claim 1, wherein the constructed first continuous geometry can receive RKPM analysis-suitable particles.

8. The method of claim 1, further including constructing a decimated point set for the first continuous geometry.

9. The method of claim 8, wherein constructing the decimated point set includes generating a regular grid of points and eliminating any points not in a domain.

10. The method of claim 1, wherein the smoothing length is determined using nearest neighbor searches.

11. A method of creating an analysis-suitable geometry from a discrete point set, comprising:
    discretizing a set of digital points or receiving a set of digital points that are discrete, wherein one point in the set of digital points originates internally with respect to an outer perimeter of an object to be modeled;
    automatically computing a smoothing length at each discrete point;
    computing a representative volume at each discrete point based on a solvability of a moment matrix;
    constructing a first continuous geometry via an implicit mathematical representation through a mesh free method;
    adjusting a total volume of the first continuous geometry by scaling the representative volumes at each discrete point; and
    connecting the first continuous geometry with a second continuous geometry to allow the first and second continuous geometries to interact during a simulation.

12. The method of claim 11, further including simulating functionality of the first and second continuous geometries by applying loading conditions and boundary conditions to each being simulated.

13. The method of claim 11, wherein the first and second continuous geometries are representative of anatomical structures.

14. The method of claim 11, wherein the constructed first continuous geometry may receive RKPM analysis-suitable particles.

15. The method of claim 11, further including constructing a decimated point set for the first continuous geometry.

16. The method of claim 15, wherein constructing the decimated point set includes generating a regular grid of points and eliminating any points not in the domain.

* * * * *